United States Patent
Di Giacomo et al.

(10) Patent No.: US 11,476,307 B2
(45) Date of Patent: Oct. 18, 2022

(54) PHOTOVOLTAIC DEVICE AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Francesco Di Giacomo, Rome (IT); Herbert Lifka, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 17/293,409

(22) PCT Filed: Nov. 15, 2019

(86) PCT No.: PCT/NL2019/050746
§ 371 (c)(1),
(2) Date: May 12, 2021

(87) PCT Pub. No.: WO2020/101494
PCT Pub. Date: May 22, 2020

(65) Prior Publication Data
US 2021/0408123 A1    Dec. 30, 2021

(30) Foreign Application Priority Data
Nov. 16, 2018   (EP) .................... 18206738

(51) Int. Cl.
*H01L 27/30*     (2006.01)
*H01G 9/20*      (2006.01)
*H01L 51/44*     (2006.01)

(52) U.S. Cl.
CPC ......... *H01L 27/301* (2013.01); *H01G 9/2081* (2013.01); *H01L 51/445* (2013.01)

(58) Field of Classification Search
CPC .... H01L 27/301; H01L 51/445; H01G 9/2081
See application file for complete search history.

(56) References Cited

U.S. PATENT DOCUMENTS

| | | |
|---|---|---|
| 2010/0313935 A1 | 12/2010 | Coakley et al. |
| 2012/0295395 A1 | 11/2012 | Lu et al. |
| 2021/0288112 A1* | 9/2021 | Heimke ............. H01L 51/0037 |

FOREIGN PATENT DOCUMENTS

| | | | |
|---|---|---|---|
| EP | 3389096 A1 | 10/2018 | |
| WO | WO 2018/055214 A1 | 3/2018 | |
| WO | WO-2018055214 A1 * | 3/2018 | ........... H01L 27/301 |

OTHER PUBLICATIONS

European Patent Office, International Search Report in corresponding International Application No. PCT/NL2019/050746, dated Dec. 16, 2019 (3 pages).

* cited by examiner

*Primary Examiner* — Tae-Sik Kang
(74) *Attorney, Agent, or Firm* — Leydig, Voit & Mayer, Ltd.

(57) ABSTRACT

A photovoltaic device (1) is provided with plurality of mutually subsequent photovoltaic device cells (1A, ..., 1F) arranged along a direction of first device axis (D1). Each pair of a photovoltaic device cell and its successor are serially arranged through an interface region (1CD), further having a bypass function, and which extends along a second axis (D2), transverse to the first axis.

13 Claims, 13 Drawing Sheets

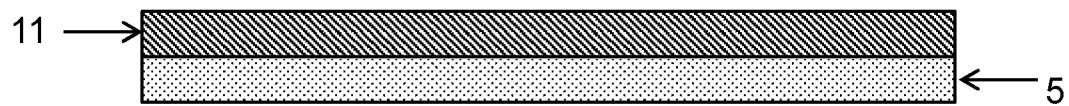
FIG. 5A (S1)
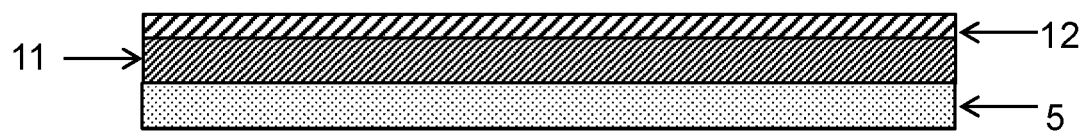
FIG. 5B (S2)
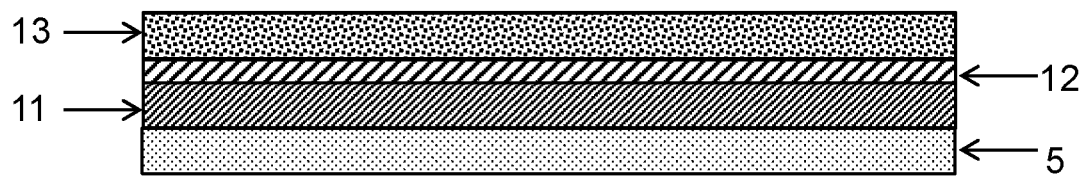
FIG. 5C (S3)
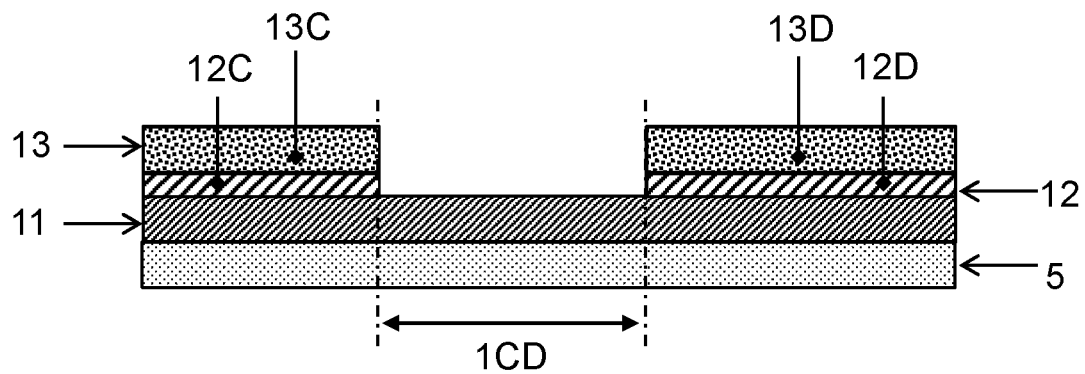
FIG. 5D (S4)

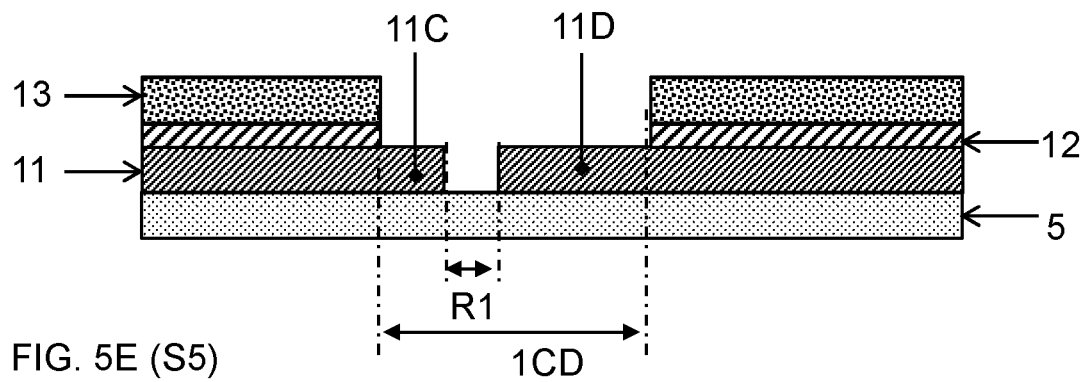
FIG. 5E (S5)
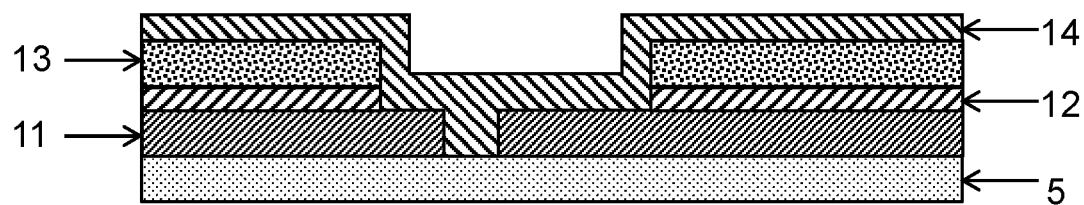
FIG. 5F (S6)
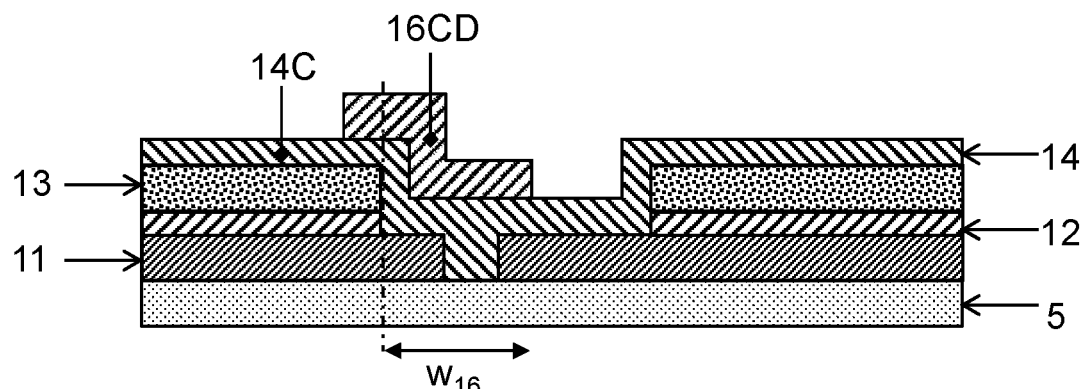
FIG. 5G (S7)
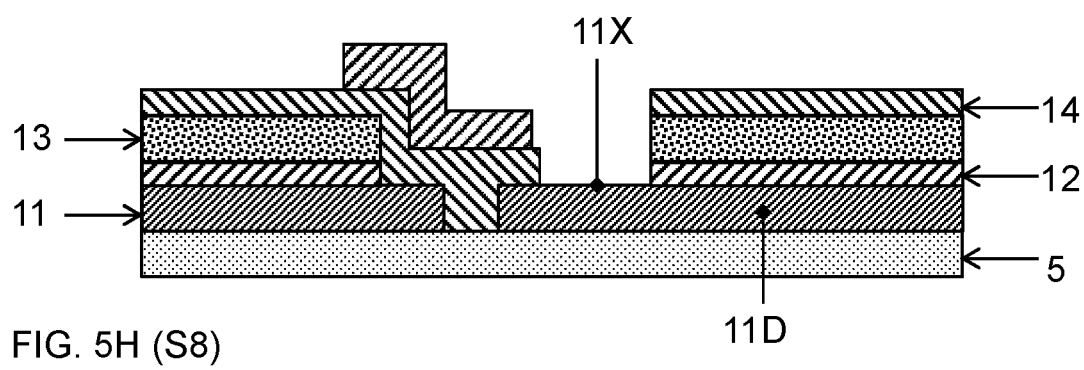
FIG. 5H (S8)

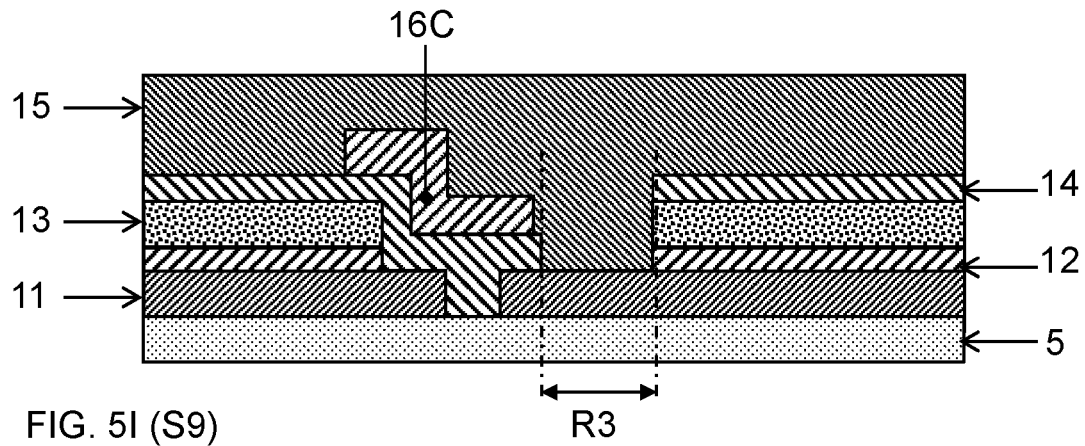
FIG. 5I (S9)
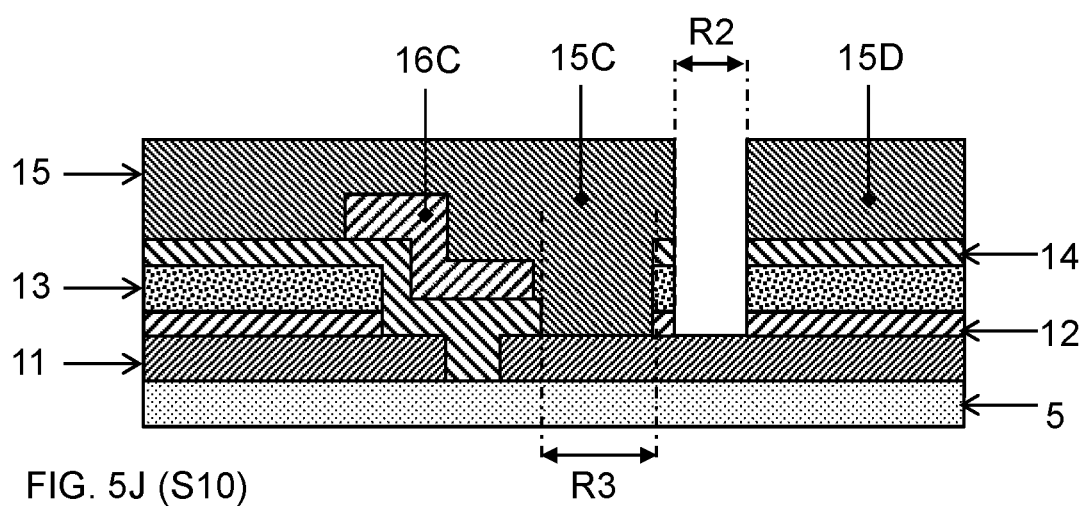
FIG. 5J (S10)
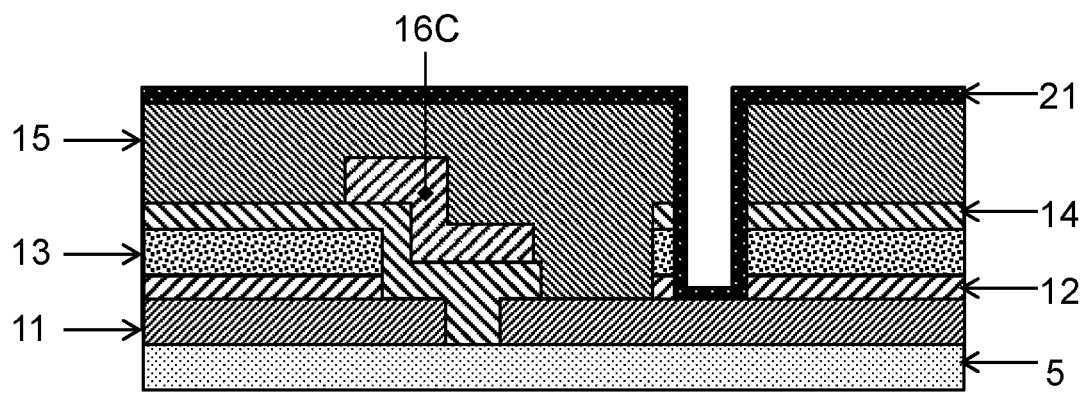
FIG. 5K (S11)

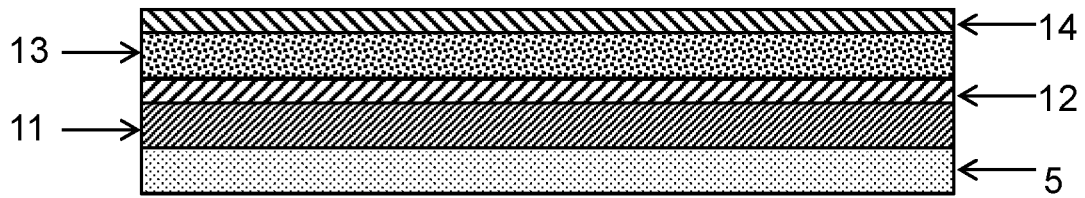
FIG. 6A (S14)
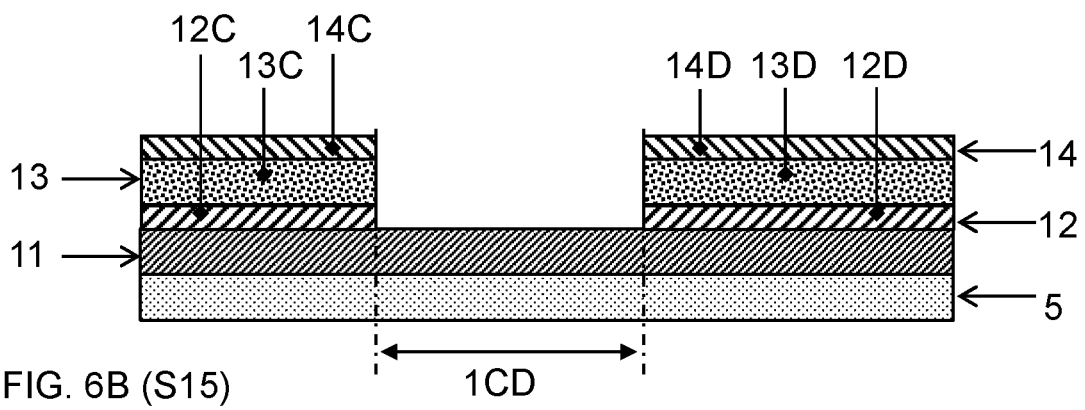
FIG. 6B (S15)
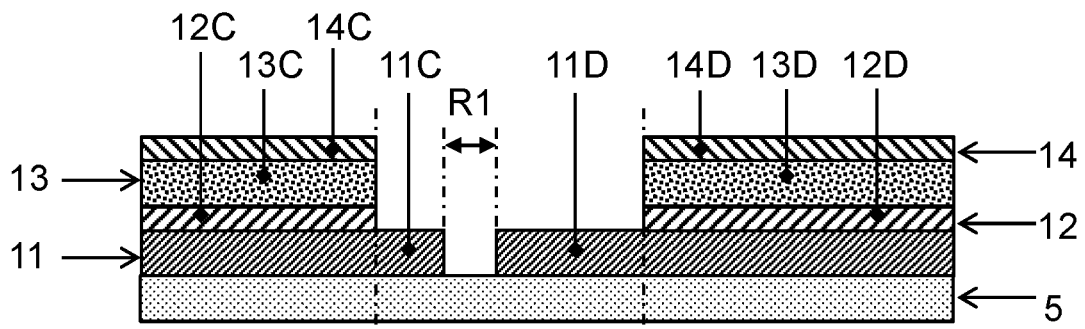
FIG. 6C (S16)
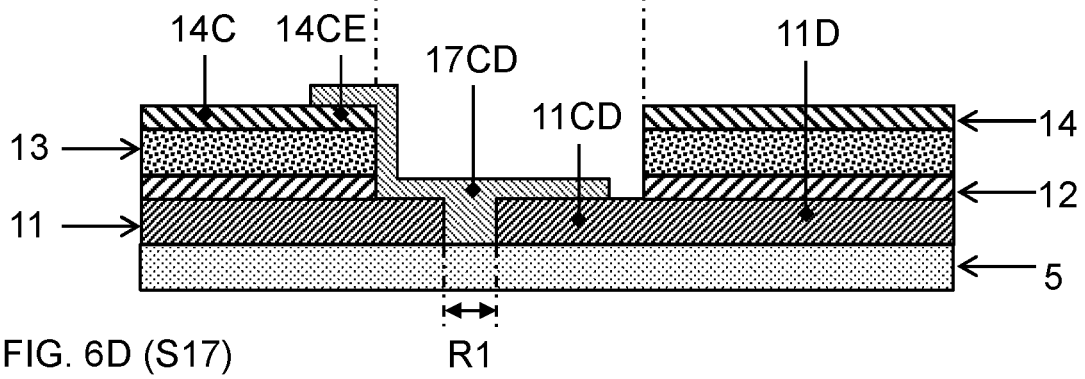
FIG. 6D (S17)

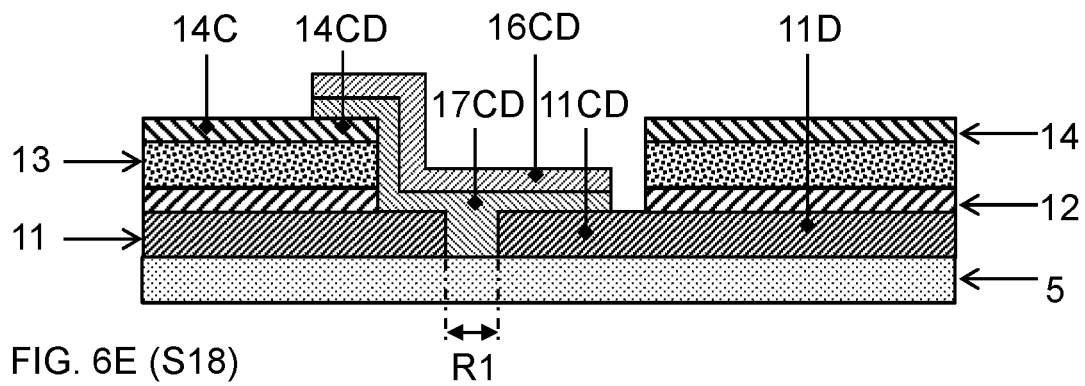
FIG. 6E (S18)
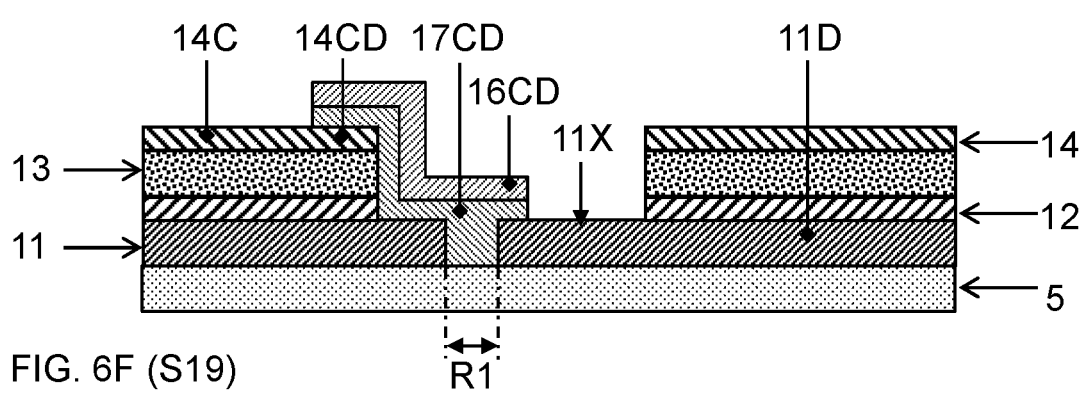
FIG. 6F (S19)
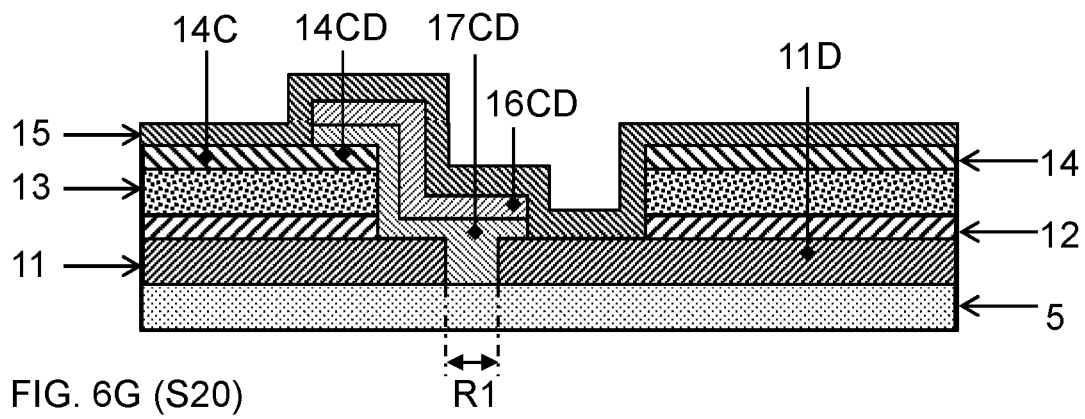
FIG. 6G (S20)
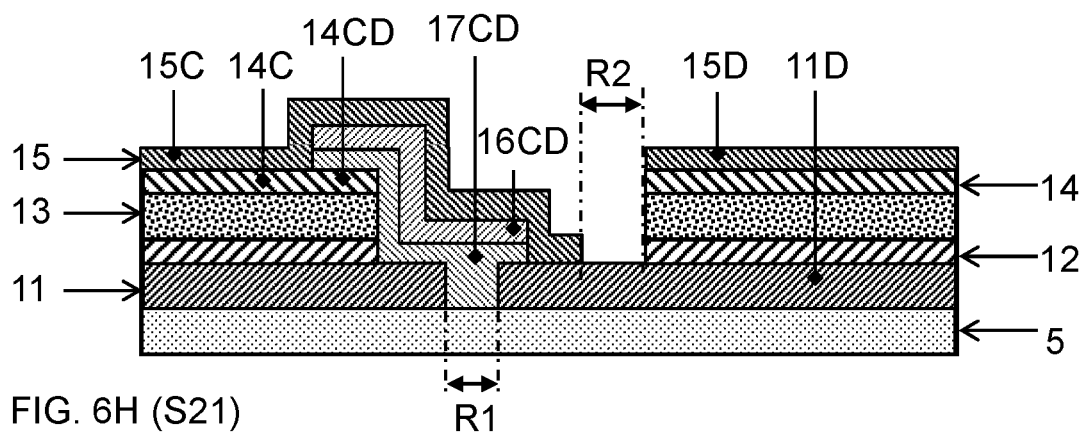
FIG. 6H (S21)

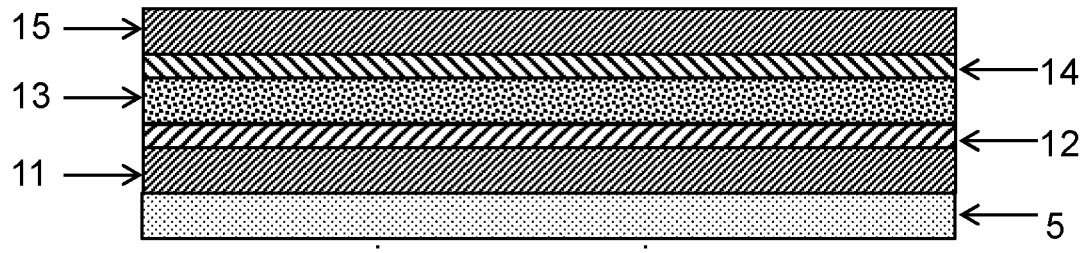
FIG. 7A (S25)
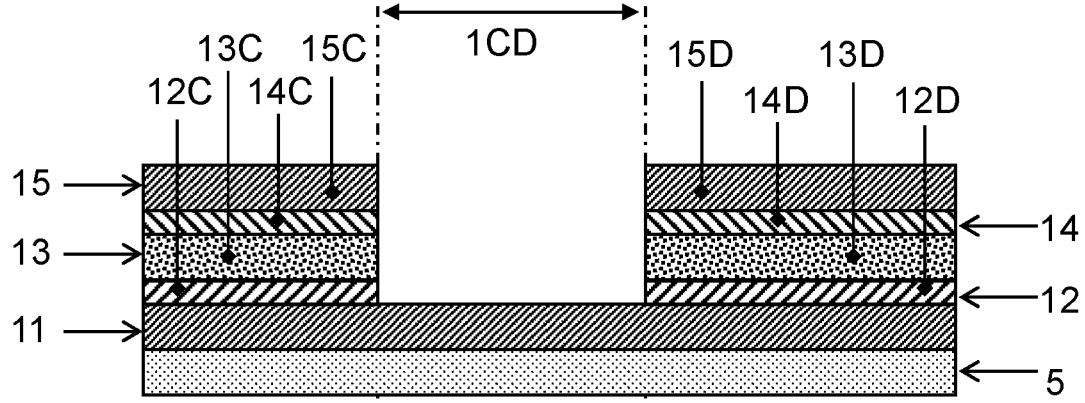
FIG. 7B (S26)
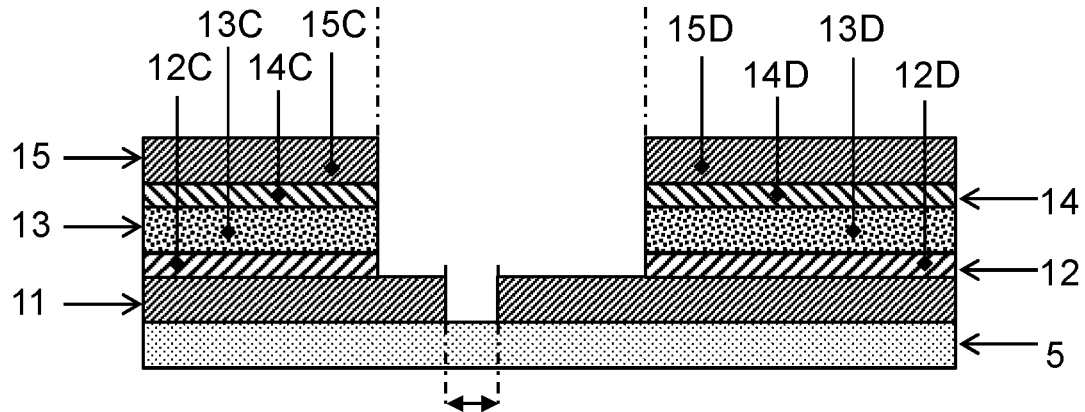
FIG. 7C (S27)

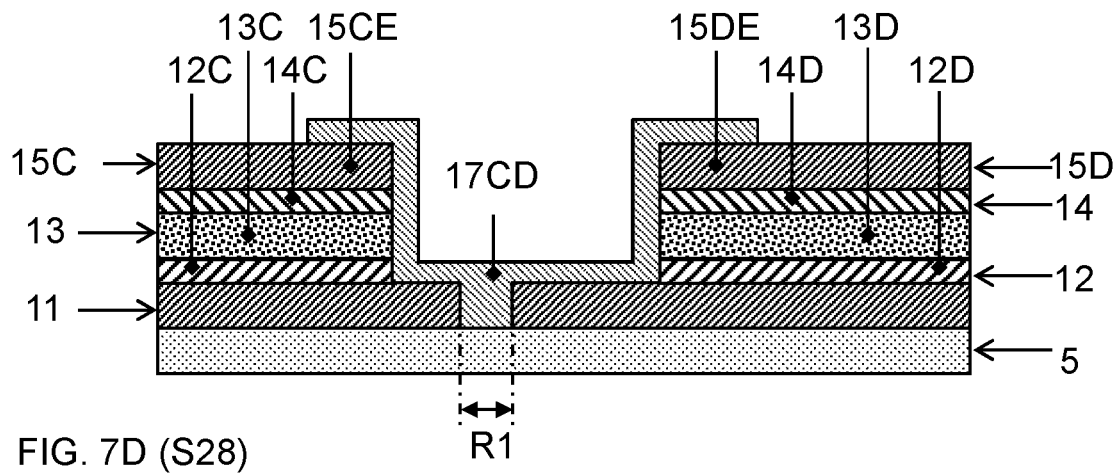
FIG. 7D (S28)
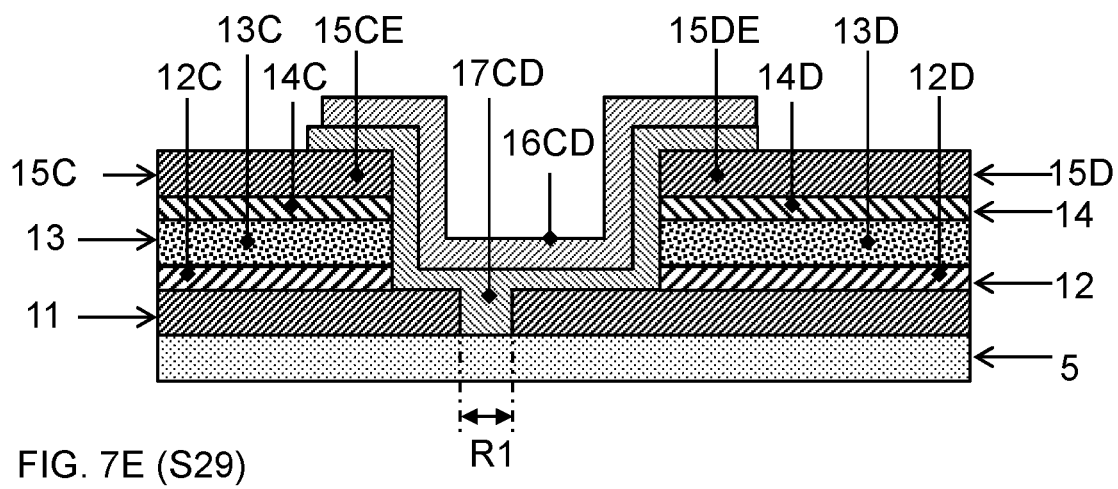
FIG. 7E (S29)
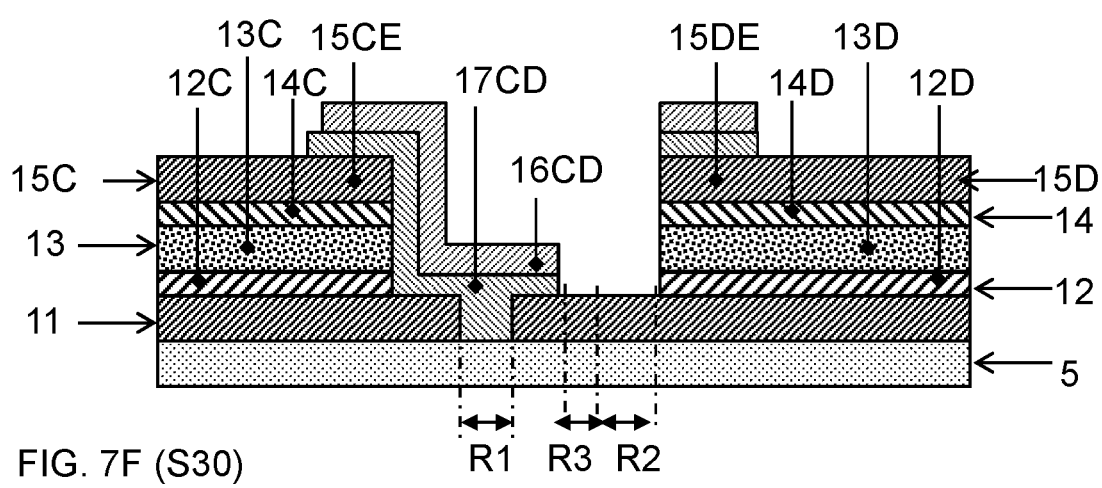
FIG. 7F (S30)

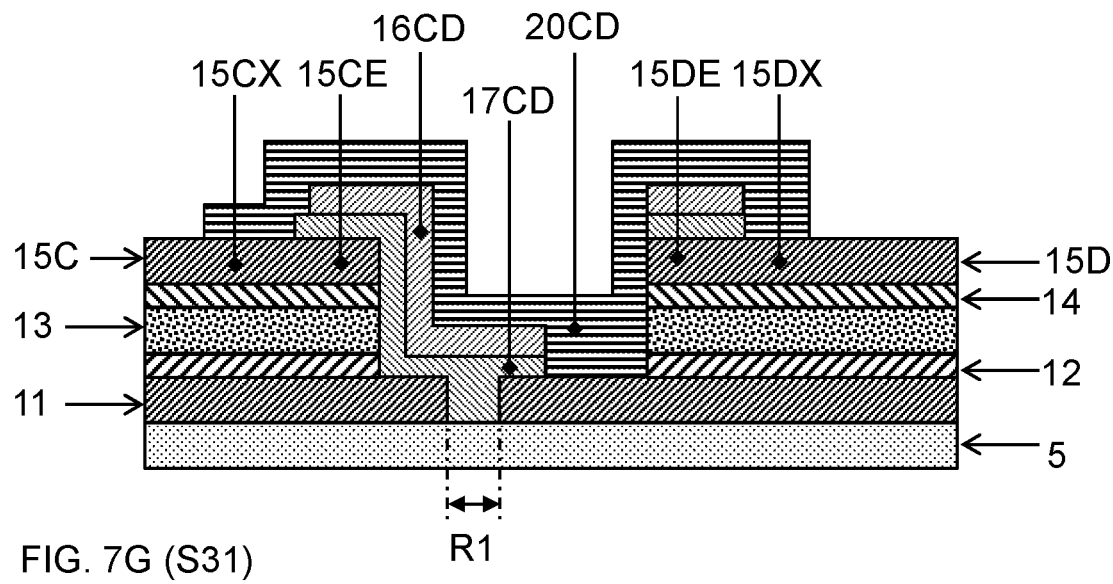
FIG. 7G (S31)
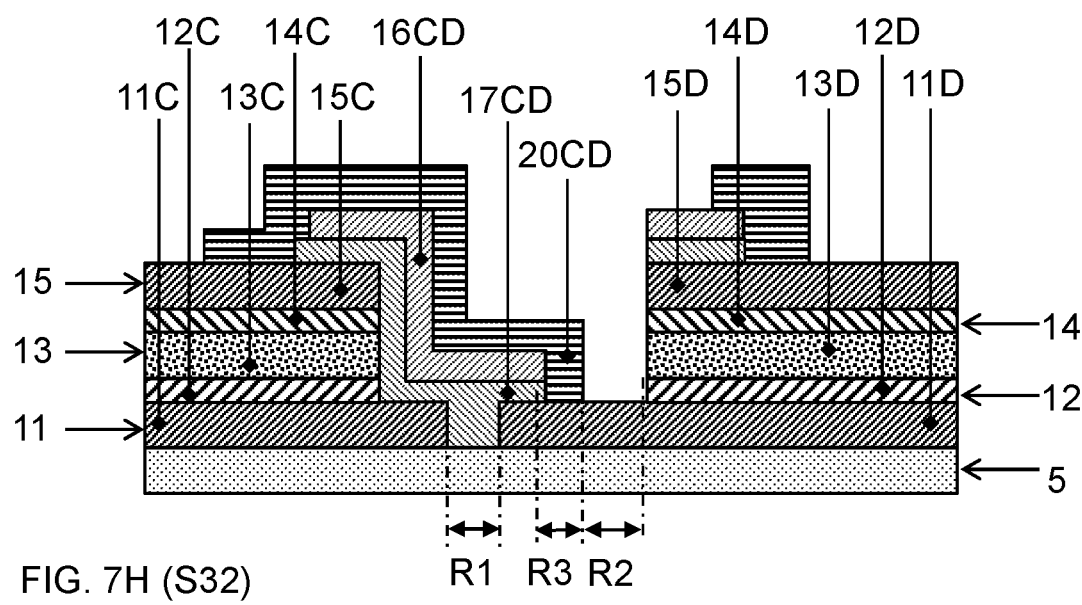
FIG. 7H (S32)

PHOTOVOLTAIC DEVICE AND METHOD OF MANUFACTURING THE SAME

CROSS-REFERENCE TO RELATED APPLICATIONS

This patent application is a U.S. National Phase of PCT International Application No. PCT/NL2019/050746, filed Nov. 15, 2019, which claims priority to European Application No. 18206738.9, filed Nov. 16, 2018, which are both expressly incorporated by reference in their entireties, including any references contained therein.

BACKGROUND OF THE INVENTION

Field of the Invention

The present invention relates to a photovoltaic device.
The present invention further relates to a method of manufacturing a photovoltaic device.

Related Art

Photovoltaic devices are typically provided as panels having a plurality of serially arranged photovoltaic device cells. Therewith a relatively high voltage can be generated, which is favorable for a good efficiency. However, if a photovoltaic cells is inactive, for example because it is in a shadowed region, it will tend to block the device current and at the same time it will be polarized in a direction opposite to that in the operational state (reverse bias). This will not only result in a direct loss of efficiency, but it will also have the effect that energy is dissipated in the inactive cell, as a result of which that cell is damaged due to heat development therein and the reverse bias can induce a further degradation. One approach is to provide a bypass diode connected in parallel with each cell. If a cell is inactive, this provides an alternative current path, therewith avoiding efficiency loss and damage to that cell. Mounting such bypass diodes as separate elements is unattractive, as this would required complicated manufacturing steps and also increase the risk of failure caused by the external connections. For amorphous silicon based photovoltaic devices it is known to provide for a separate PN junction by extrinsic doping, creating an integrated bypass diode in the interconnection. Although an extrinsic doping is a relatively simple process in silicon technology, it is complicated to apply this perovskite thin-film technology. Moreover to provide an extrinsic doping requires vacuum, lithography and other expensive process steps.

It is noted that WO 2018/055214 A1 pertains to organic photovoltaic components, comprising integrated bypass diodes, which are integrated into the optoelectronic stack, in order to increase the efficiency and the service life of the optoelectronic component in the case of partial shading/shading of individual cells or cell segments.

SUMMARY

It is an object to provide a photovoltaic device having integrated bypass diodes that can be manufactured with the improved method.

It is a further object to provide an improved method of manufacturing a photovoltaic device having integrated therewith the bypass diodes with a relatively simple process suitable for perovskite photovoltaic technology.

A photovoltaic device in accordance with this object is defined in claim 1, and embodiments thereof are defined in claims 2-6.

A method according to this object is provided in claim 7, and embodiments thereof are defined in claims 8-11.

In the photovoltaic device as claimed in claim 1 the photovoltaic cells are serially arranged through interface regions. The interface region between each pair of mutually succeeding photovoltaic cells provides for their electrical series connection and also includes a PN-junction that serves as a bypass for an adjoining PV-cell in case it cannot actively contribute to the operation of the photovoltaic device due to a shadow cast thereon. In the photovoltaic device as claimed, the PN-junction can extend over the full length of the interface region between subsequent photovoltaic cells, and therewith provide for a relatively large area available to the bypass current if necessary. The relatively large available area renders it possible that a relatively large class of materials is suitable for the PN-junction, including less conductive materials.

In a first embodiment of the photovoltaic device, the first layer of the PN-junction is formed by an extension of the preceding second electrode side charge carrier transport layer portion. This embodiment is advantageous in that it can be manufactured with a number of steps that does not exceed the number of steps that would be required to properly insulate the photovoltaic layer portion boundaries.

In a second embodiment the first layer of the PN-junction is formed as a separate layer. Therewith an even larger class of materials is available for this layer, as it is not necessary that it is suitable also as a material for the second electrode side charge carrier transport layer.

In a third embodiment, an electrical series connection between mutually subsequent photovoltaic cells is provided as a separate electrically conductive layer. It is an advantage of this embodiment that a second electrode layer portion and a second electrode side charge carrier transport layer portion of a preceding photovoltaic cell can extend over the photovoltaic layer portion of that photovoltaic cell until its boundary with the interface region. Therewith optimally using surface area for photo-electric conversion.

A substrate for the photo-voltaic device may be glass or be a resin base material. Such resin base materials preferably include polyethylene terephthalate (PET), polyethylene naphthalate (PEN), polyimide (PI), polyetherimide (PEI), polyethersulfone (PES), polysulfone (PSF), polyphenylene sulfide (PPS), polyether ether ketone (PEEK), polyarylate (PAR), and polyamide-imide (PAD. Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc. Dependent on the application a thickness of the substrate may be selected in the range of a relatively small value e.g. 50 micron and a relatively large value, e.g. a few mm or more. It is not necessary that the substrate is transparent, provided that light can access the photo-voltaic layer from a side of the photovoltaic device opposite the substrate. In that case it may further be contemplated to use an (electrically insulated) metal foil as the substrate.

The first electrode layer is a transparent electrode layer. Examples of transparent electrically conductive materials are organic materials such as polyaniline, polythiophene, polypyrrole or doped polymers. Apart from organic materials, various inorganic transparent, electrically conducting materials are available like ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. The transparent electrically conductive electrode layer may have a thickness in the range of a few tens of nm to a few hundreds of nm, for example in a range between 100 and 200 nm, for example about 120 nm. As the electrical conductivity of a transparent electrode layer is relatively low it may be shunted by electrical conductors, these may be formed as a grid on the transparent electrode layer.

It is not necessary that both electrode layers are transparent. The non-transparent electrode layer can have a relatively large thickness so that no concessions need to be made in regard to the conductivity. A non transparent electrode layer may for example be formed of a layer of suitably conductive material, like aluminum, silver or copper. Also the non-transparent electrode layer, may be provided as a combination of sub layers, e.g. a relative thick main sub layer of an above-mentioned suitably conductive material, e.g. having a thickness of 100 to a few 100 nm or more and a relatively thin interface sub layer at one or both faces of the main sub layer, e.g. a sub layer of a few nm of Mo or Ni.

Perovskite materials are an important class of materials for use in a photo-voltaic layer, or conversion sub layer, as these materials can be processed at relatively low temperatures, and yet have a conversion efficiency that comes close to that achieved with silicon based photo-voltaic devices. In an embodiment the photo-electric conversion layer is provided of a perovskite material. Perovskite materials typical have a crystal structure of $ABX_3$, wherein A is an organic cation as methylammonium ($CH_3NH_3$)+, B is an inorganic cation, usually lead ($Pb^{2+}$), and X is a halogen atom such as iodine (I—), chlorine (Cl—) or bromine (Br—). Perovskite materials are particularly advantageous in that they can be processed relatively easily and in that their bandgap can be set to a desired value by a proper choice of the halide content. A typical example is methylammonium lead trihalide ($CH_3NH_3PbX_3$), with an optical bandgap between 1.5 and 2.3 eV depending on halide content. Another more complex structure example is Cesium-formamidinum lead trihalide ($Cs_{0.05}(H_2NCHNH_2)_{0.95}PbI_{2.85}Br_{0.15}$) having a bandgap between 1.5 and 2.2 eV. Other metals such as tin may replace the role of Pb in perovskite materials. An example thereof is $CH_3NH_3SnI_3$. Also combinations of Sn with Pb perovskites having a wider bandgap in the range of 1.2 to 2.2 eV are possible. Although perovskite materials are preferred for the reasons specified above, also other materials are suitable, for example copper indium gallium selenide (CIGS).

Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Typical examples for this purpose are metal oxides, like nickel oxide, and other compounds, like MoSe. In an embodiment a hole transport sub layer, may have a thickness in the range of 10 to 200 nm. An electron transport sub layer may be formed of a metal oxide, like $TiO_2$, $SnO_2$, $ZrO_2$ and ZnO:S. The electron transport sub layer may have a thickness in the range of a few nm, e.g. 5 nm to a few tens of nm.

It is noted that subsequently including implies that at least these layers are present, and should be present in the specified order. This does not exclude that further layers may be included in the stack, such as a charge carrier transport layer between an electrode layer and the photovoltaic layer, or a barrier layer covering the stack to serve as a barrier to moisture and oxygen. A layer may comprise a plurality of sub-layers. For example an electrode layer may comprise a relatively thick main sub layer of well electrically conductive material, e.g. a layer of copper or aluminum or silver having a thickness of 100 to a few 100 nm or more and a relatively thin interface sub layer at one or both faces of the main sub layer, e.g. a sub layer of a few nm of Mo or Ni.

Typically metal oxides, for example $SnO_2$, $ZnO_2$ and $TiO_2$ may serve as materials for an electron transport layer. The material NiO is a typical example for use in a hole transport layer. The charge carrier layers may have a thickness in the range of a few tens of nm to about 150 nm, for example in the range of 35 to 100 nm, for example about 70 nm.

BRIEF DESCRIPTION OF THE DRAWINGS

These and other aspects are described in more detail with reference to the drawing. Therein:

FIG. 1A is a cross-sectional view according to IA in FIG. 1B and FIG. 1B is a top-view according to IB in FIG. 1A;

FIG. 5A-5K show a method to manufacture the first embodiment of the photovoltaic device;

FIG. 6A-6H show a method to manufacture the second embodiment of the photovoltaic device;

FIG. 7A-7I1 show a method to manufacture the third embodiment of the photovoltaic device;

DETAILED DESCRIPTION OF EMBODIMENTS

Figure 1A:
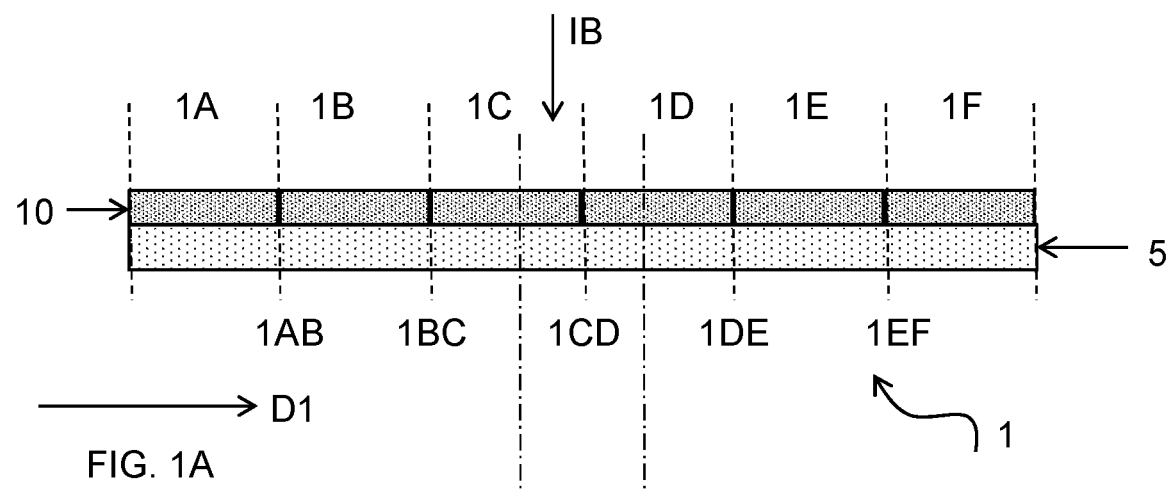
FIGS. 1A and 1B schematically show a photovoltaic device with a plurality of serially connected photovoltaic device cells that are arranged in a first direction on a substrate. Therein
Figure 1B:
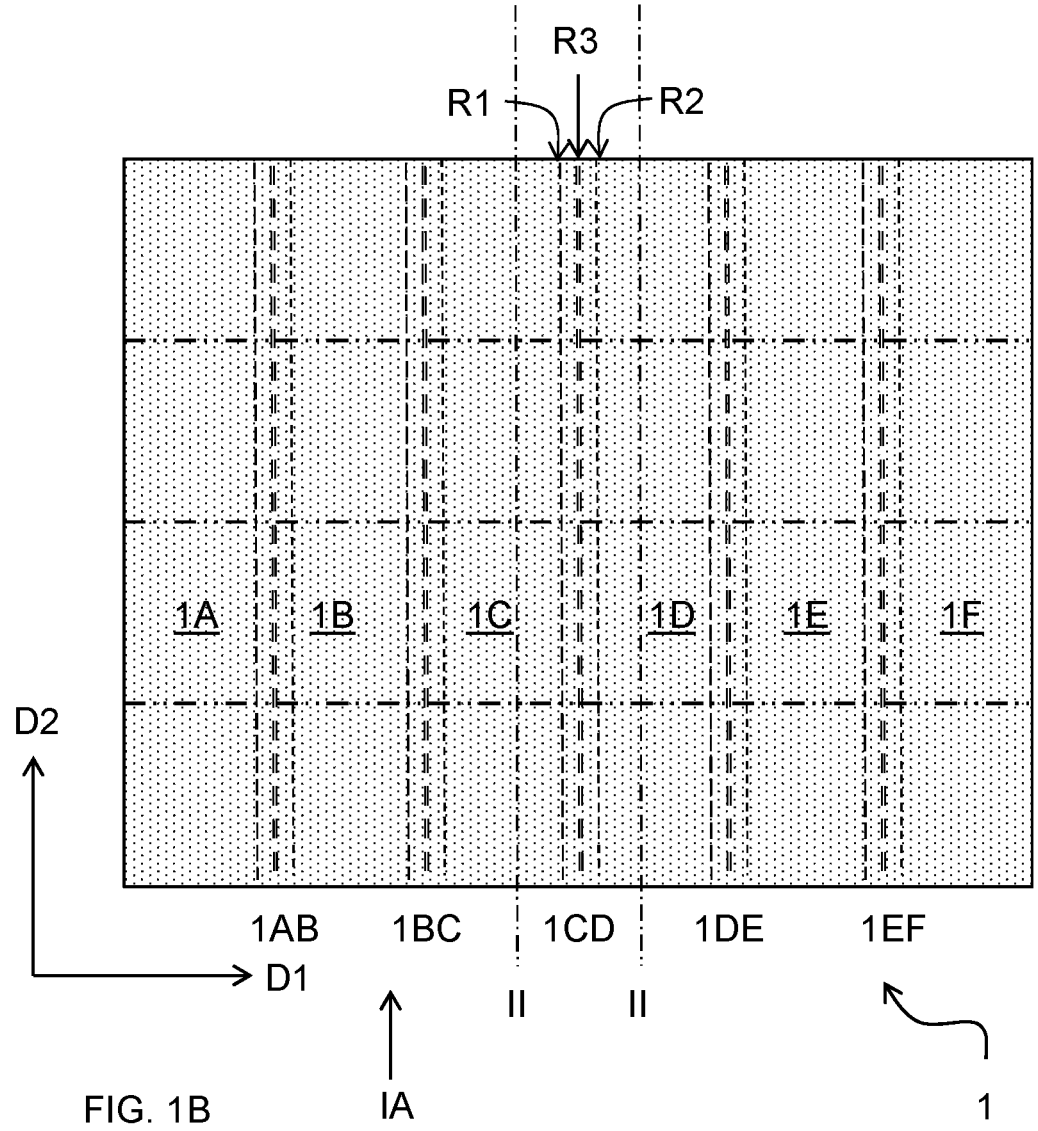

FIG. 1A, 1B schematically shows a photovoltaic device 1 with a stack of layers 10 on a substrate 5. The substrate defines a plane with a first and a second mutually transverse device axis D1, D2. The photovoltaic device 1 has a plurality of mutually subsequent photovoltaic device cells 1A, . . . , 1F arranged along a direction of the first device axis D1, D2. The mutually subsequent photovoltaic device cells 1A, . . . , 1F are electrically arranged in series, such that device cell 1A is connected in series with device cell 1B through interface region 1AB, device cell 1B is connected in series with device cell 1C, through interface region 1BC, etc. Hence each cell (except the last one) and its successor form a pair of serially arranged cells. In a pair, e.g. 1C, 1D of photovoltaic cells, the photovoltaic cell 1C preceding their interface region 1CD is denoted herein the preceding photovoltaic cell 1C, and the photovoltaic cell 1D succeeding their interface region is denoted as succeeding photovoltaic cell 1D. By way of example, an embodiment is shown with 6 photovoltaic cells. However, in practice a substantially higher number of cells may be comprised or alternatively a lower number.

As noted above, optional intermediate layers may be present in addition to the layers that are specifically described below. Such intermediate layers may be locally applied, and may for example be absent in the interface region.

As schematically shown in FIG. 1B, an interface region, e.g. 1CD comprises a first electrode layer interruption region R1, a second electrode layer interruption region R2 and a connection region R3 between the first electrode layer interruption region R1 and the second electrode layer interruption region R2, all extending in the second device direction D2.

Figure 2:
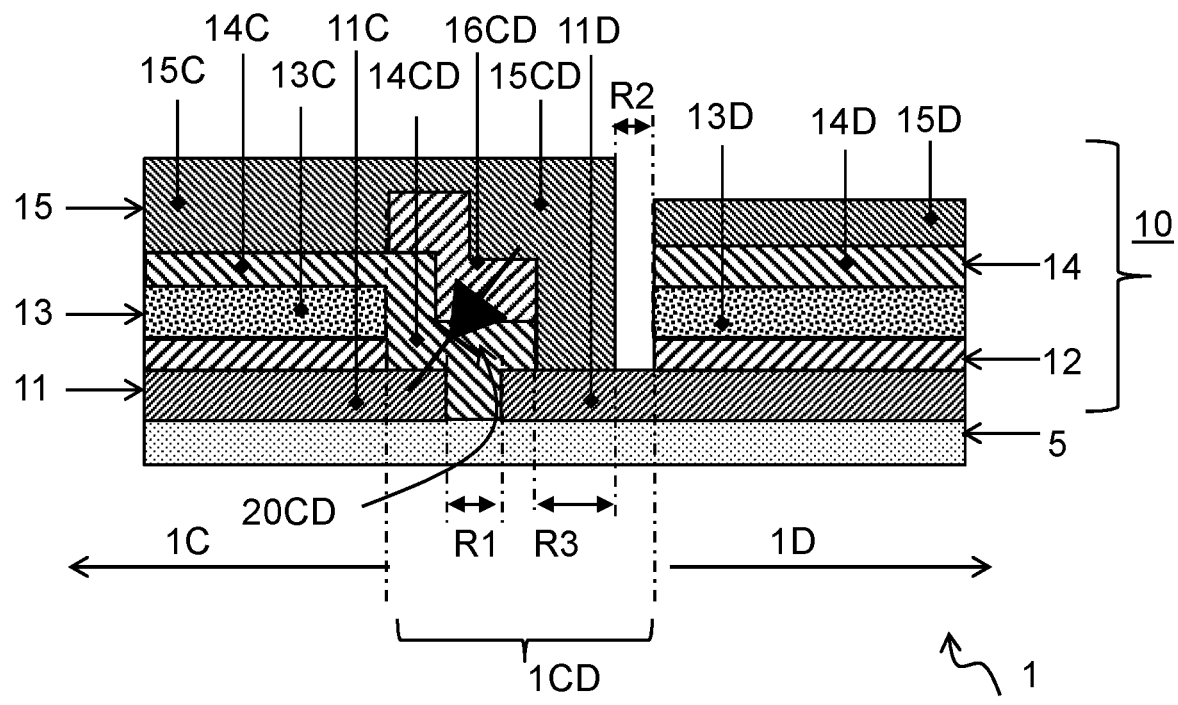
FIG. 2 shows a portion of a cross-section of an interface between subsequent photovoltaic device cells in a first embodiment of the photovoltaic device.

An embodiment of the photovoltaic device 1 is now described in more detail with reference to FIG. 2. FIG. 2 shows a cross-section of a portion of the photovoltaic device 1 according II-II in FIG. 1A, 1B. The cross-section shows an interface region 1CD, and partly shows its associated preceding photovoltaic device cell 1C and succeeding photovoltaic device cell 1D.

FIG. 2 shows that the stack 10 subsequently includes a first electrode layer 11, a first electrode side charge carrier transport layer 12 of a first conductivity type, a photovoltaic layer 13, a second electrode side charge carrier transport layer 14 of a second conductivity type opposite to said first conductivity type and a second electrode layer 15. I.e. if the first electrode side charge carrier transport layer 12 is of type n, then the second electrode side charge carrier transport layer 14 is of type p and reversely. Each of the photovoltaic device cells 1A, . . . , 1F comprises a respective portion of each layer in the stack of layers 10.

It is noted that in other embodiments, the first electrode side charge carrier transport layer 12 of a first conductivity type may be omitted.

The interface region 1CD comprises a conductive layer portion 15CD and a junction layer pair 14CD,16CD.

As further shown in FIG. 2 the interface region 1CD partitions the first electrode layer 11 with its first electrode layer interruption region R1 into a preceding first electrode layer portion 11C, that 11C forms part of the preceding photovoltaic device cell 1C and a succeeding first electrode layer portion 11D that forms part of the succeeding photovoltaic device cell 1D.

As further shown in FIG. 2, with its second electrode layer interruption region R2, that succeeds its first electrode layer interruption region R1, the interface region 1CD partitions the second electrode layer 15 into a preceding second electrode layer portion 15C that forms part of the preceding photovoltaic device cell 1C and a succeeding second electrode layer portion 15D that forms part of the succeeding photovoltaic device cell 1D. The interface region 1CD also partitions the layer 12, 13 and 14 between the first electrode layer 11 and the second electrode layer 15 into a preceding an a succeeding portion.

The conductive layer portion 15CD electrically connects the preceding second electrode layer portion 15C with the succeeding first electrode layer portion 11D in the connection region R3 that extends between the first and the second electrode layer interruption regions R1, R2. The junction layer pair 14CD, 16CD comprises a first layer 14CD of the second conductivity type facing the preceding first electrode layer portion 11C and a second layer 16CD of the first conductivity type facing the conductive layer portion 15CD.

As schematically shown in FIG. 2, the junction layer pair 14CD, 16CD forms a bypass diode for the preceding photovoltaic device cell 1C.

Figure 2C:
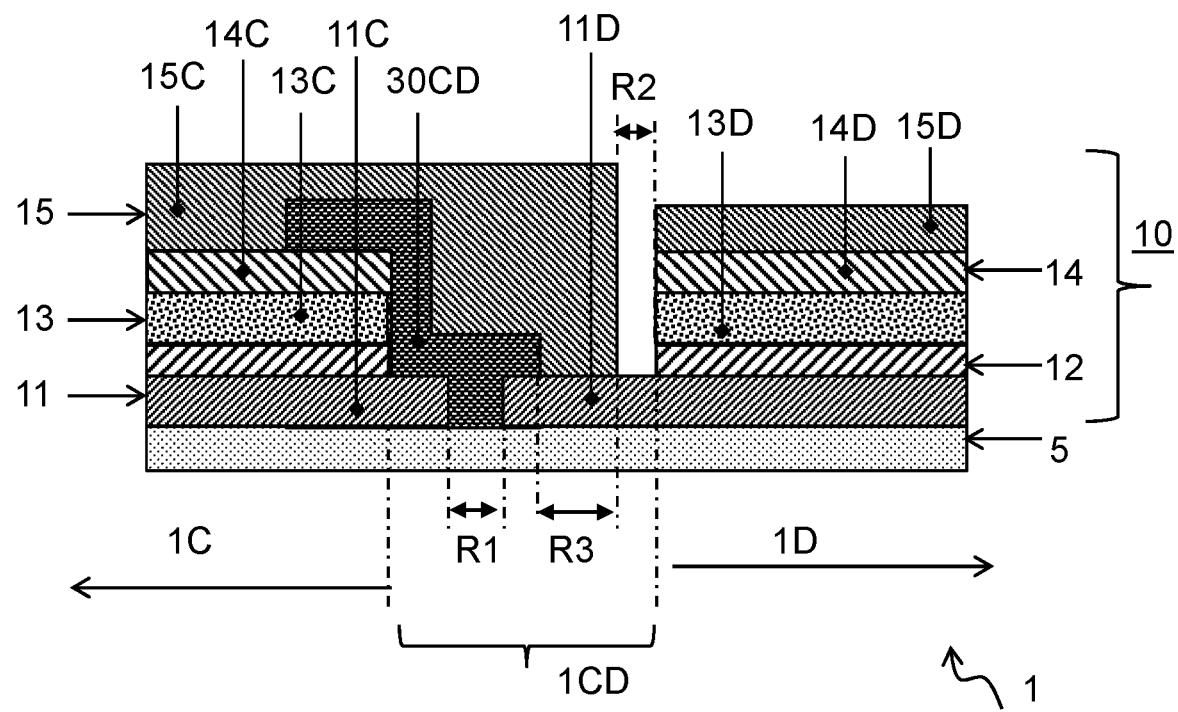
FIG. 2C for comparison shows an embodiment not according to the invention.
Figure 2A:
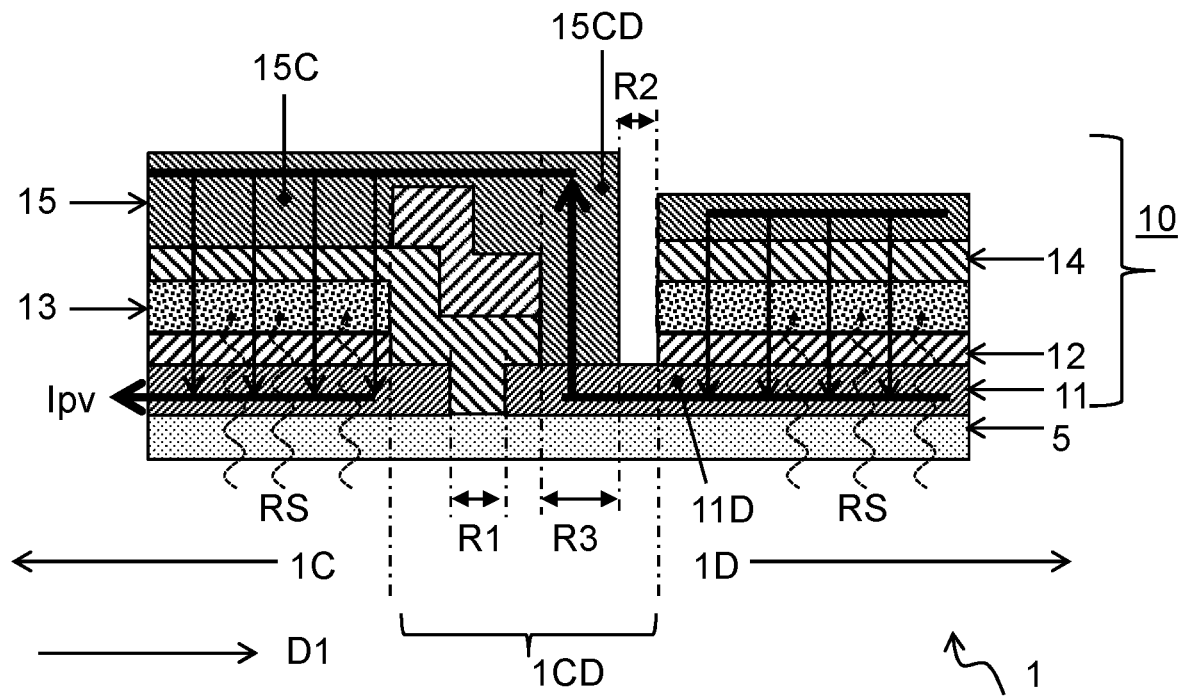
FIG. 2A shows a first operation state.

As shown in FIG. 2A, during normal operation, the interface region 1CD provides for a serial arrangement of the photovoltaic device cells 1C, 1D, in allowing a photovoltaic current Ipv to flow generated by the photovoltaic device cells 1C, 1D from solar radiation RS via the conductive layer portion 15CD from the succeeding first electrode layer portion 11D to the preceding second electrode layer portion 15C.

Figure 2B:
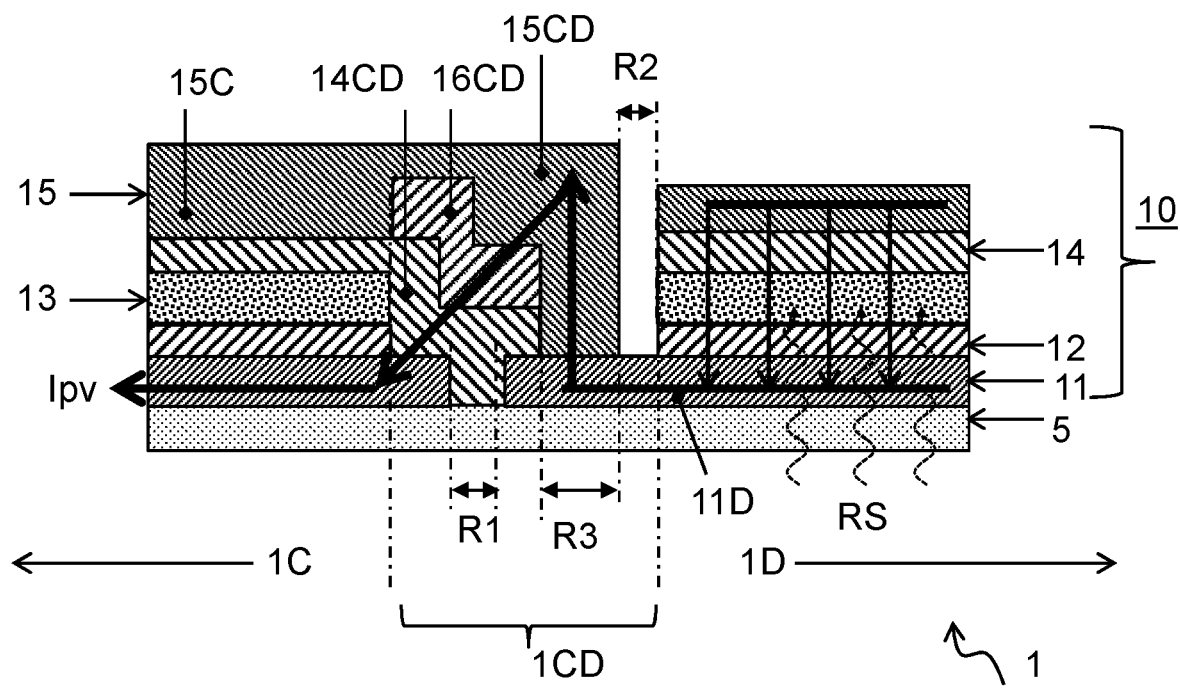
FIG. 2B shows a second operation state.

In case the photo-voltaic device cell 1C is non-functional, as shown in FIG. 2B, for example as a result of the shadow cast there over, the junction layer pair 14CD, 16CD forms a bypass for the preceding photovoltaic device cell 1C. In the embodiment shown, it is presumed that the first conductivity type is an n-conductivity type, i.e. the first electrode side charge carrier transport layer 12 is an electron transport layer and the second conductivity type is a p-conductivity type, implying that i.e. the second electrode side charge carrier transport layer 14 is a hole transport layer. However, in an alternative embodiment the first conductivity type is a p-conductivity type and the second conductivity type is an n-conductivity type. As noted above, it is not essential that the first electrode side charge carrier transport layer 12 is present in the device. Also for the functioning of the bypass diode, the presence of this layer is not necessary.

In the embodiment of FIG. 2, the conductive layer portion 15CD that electrically connects the preceding second electrode layer portion 15C with the succeeding first electrode layer portion 11D is formed by an extension of the preceding second electrode layer portion.

In the embodiment of FIG. 2, the first layer 14CD of the junction layer pair, also denoted as first junction layer 14C is formed by an extension of the preceding second electrode side charge carrier transport layer portion 14C. This is advantageous in that a separate deposition step for the first junction layer 14CD is obviated.

In the embodiment of FIG. 2, the first junction layer 14CD fills the interruption region R1 between the preceding first electrode layer portion 11C and the succeeding first electrode layer portion 11D. Therewith a separate filling step is superfluous. Alternatively a dedicated insulating material may be deposited in the interruption region R1.

Figure 3:
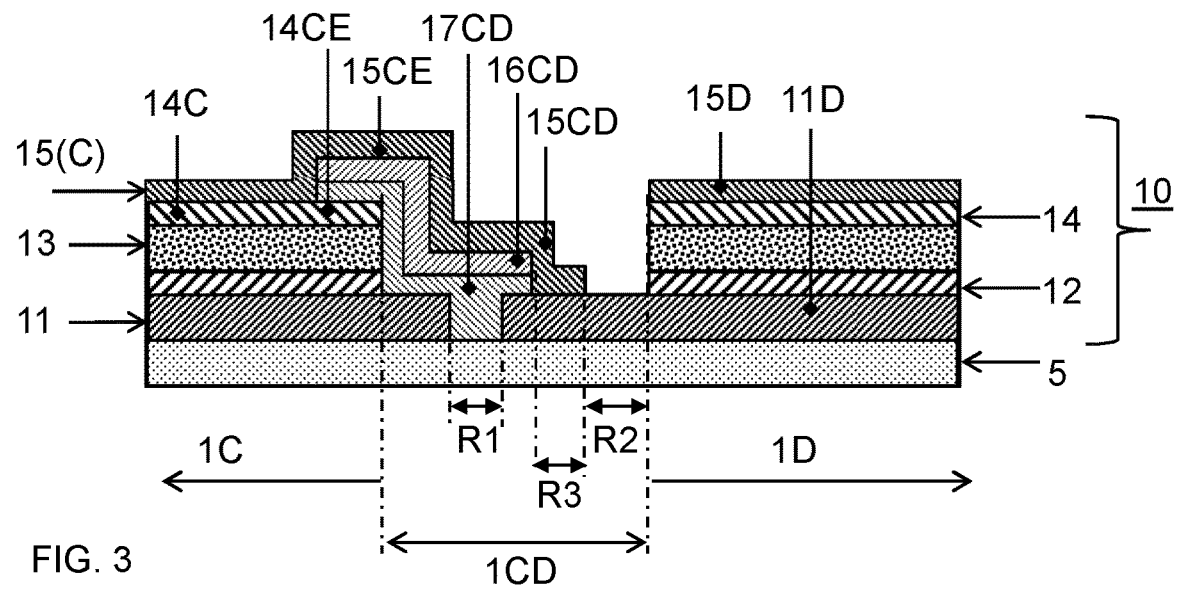
FIG. 3 shows a portion of a cross-section of an interface between subsequent photovoltaic device cells in a second embodiment of the photovoltaic device.

FIG. 3 shows an alternative embodiment. Similar to the embodiment of FIG. 2, the conductive layer portion 15CD that electrically connects the preceding second electrode layer portion 15C with the succeeding first electrode layer portion 11D is formed by an extension of the preceding second electrode layer portion. However in the embodiment of FIG. 3, the first layer 17CD of the junction layer pair is formed by a separate layer of a material of the second conductivity type that extends between an end of the preceding second electrode side charge carrier transport layer portion 14C and an end of the preceding second electrode layer portion 15C adjoining the interface region 1CD. This has the advantage that a material can be selected for this layer that optimally suited for use in a pn-junction, without concessions that would be required in case the layer is also used as a charge carrier transport layer in the photovoltaic cell regions. This implies that the layer 17CD does not have to match the energy levels of the photovoltaic layer. Other deposition techniques may be used that are particularly suitable for a linewise deposition of the layer 17CD, contrary to a full area type deposition of the second electrode side charge carrier transport layer 14. The materials for the first layer 17CD of the junction layer pair and for the second electrode side charge carrier transport layer 14 may hence be selected independent from each other for example from the class comprising metal oxides and organic semiconductors. The selection may further involve the selection of a less conductive material for the layer 17CD in case the material selected for the layer 14 would have a too high conductivity and tend to shunt the interruption region R1.

By way of example the first junction layer may be provided as a p-type layer of the material SpiroOmetad, and the second junction layer may be provided as an n-type layer of the material TiO2.

Figure 4:
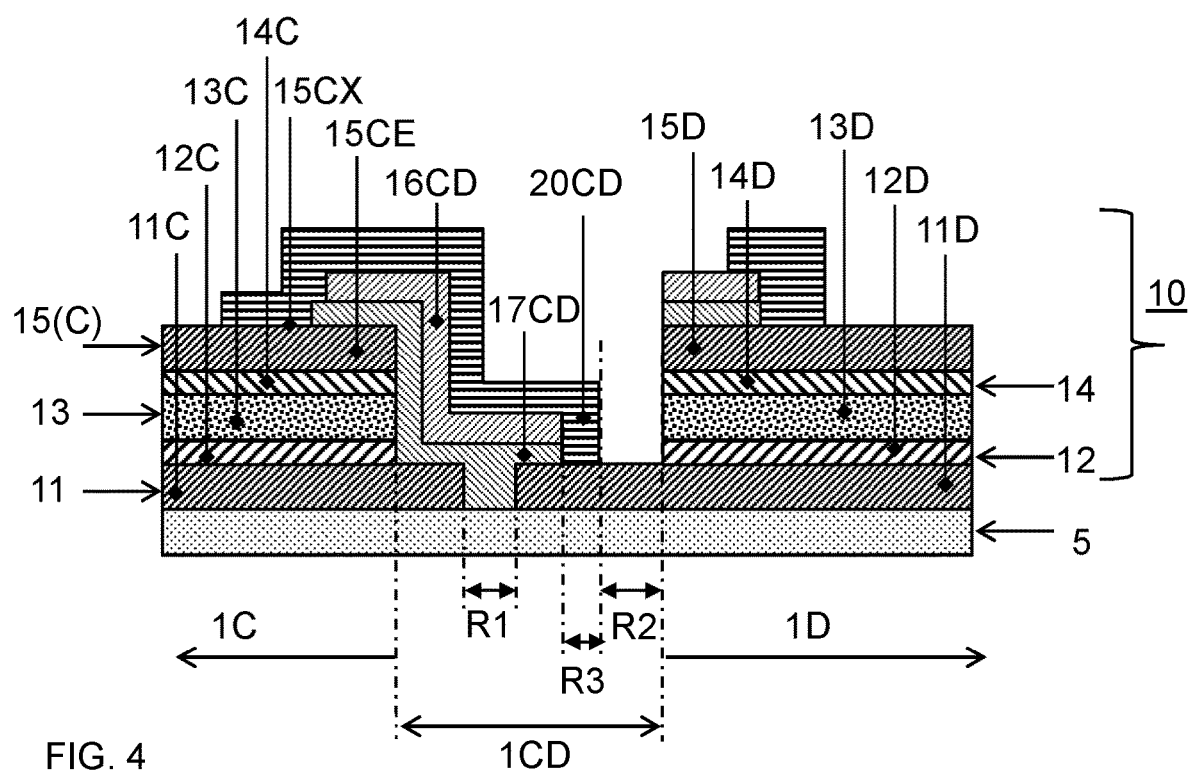
FIG. 4 shows a portion of a cross-section of an interface between subsequent photovoltaic device cells in a third embodiment of the photovoltaic device.

FIG. 4 shows an other embodiment. As in the embodiment of FIG. 3, the first layer 17CD of the junction layer pair is formed by a separate layer of a material of the second conductivity type. However, in this embodiment the separate layer 17CD extends between over an end of the preceding second electrode layer portion 15C that adjoins the interface region 1CD. Furthermore, the embodiment differs from the embodiment of FIG. 3 in that the conductive layer portion 20CD that electrically connects the preceding second electrode layer portion 15C with the succeeding first electrode layer portion 11D is a separate layer that forms an electric contact with the succeeding first electrode layer portion 11D in the connection region R3 and extends from the connection region over the junction layer pair 17CD, 16CD to a surface 15CX of the end 15CE of the preceding second electrode layer portion 15C that is left free by the junction layer pair 17CD, 16CD.

In this embodiment the second electrode layer portion 15C and the second electrode side charge carrier transport layer portion 14C can extend directly over the photovoltaic layer 13 without interruption. Therewith the operation of the photovoltaic cell is not impaired at the end adjoining the interface region An embodiment of a method of manufacturing the photovoltaic device 1 of FIG. 2 is shown in FIG. 5A 5K.

FIG. 5A-5C shows step S1-S3 wherein subsequently a first electrode layer 11, a first electrode side charge carrier transport layer 12 and a photovoltaic layer 13 are deposited on a substrate 5.

In a subsequent step S4, shown in FIG. 5D, material is removed from the photovoltaic layer 13 and the first electrode side charge carrier transport layer 12 within an interface region 1CD extending in the second device direction. This defines an interface between a preceding and a succeeding photovoltaic cell which are to be formed and serially connected. In step S4 first electrode side charge carrier transport layer portions 12C, 12D are formed within the first electrode side charge carrier transport layer 12. Furthermore photovoltaic layer portions 13C, 13D are formed within the photovoltaic layer 13. Typically step S4 is performed by laser ablation, also denoted as "P2 laser step.

In a subsequent step S5, as shown in FIG. 5E, material is removed from the first electrode layer 11 within a first electrode layer interruption region R1 within the interface region 1CD that extends in the second device direction D2. By the removal of material from the first electrode layer 11 at each side of a first elongate region R1 a preceding first electrode layer portion 11C, and a succeeding first electrode layer portion 11D are formed. Typically step S5 is performed by laser ablation, also denoted as "P1 laser step.

In step SG, shown in FIG. 5F, a second electrode side charge carrier transport layer 14 is uniformly deposited.

FIG. 5G shows a step S7, wherein a strip 16CD of material is deposited that has the same conductivity type as the first electrode side charge carrier transport layer 12. The same material may be used at that used for the first electrode side charge carrier transport layer 12, but alternatively a different material may be used for this purpose. The strip 16CD extends in the second device direction D2 and is to form the second layer of the junction layer pair in the complete device. The strip 16CD extends in the first device direction D1 over a certain width W16 beyond a boundary between the preceding photovoltaic device to be formed and the interface region. The width W16 may be chosen to have a value that provides for a PN-junction with a sufficiently large width to conduct a bypass current without an excessive heat development while not being too large to keep as much of the surface area of the photovoltaic module available for the photovoltaic cells.

The deposition of the strip 16C may take place with a patterned deposition process, for example by inkjet printing, dispensing, screen printing, lift (laser induced forward transfer), patterned spatial atomic layer deposition or by a masked vapor deposition process (spray or evaporation). It could alternatively be considered to deposit the material of the strip 16C over the full area and to remove the material outside the area reserved for the strip 16C. This would involve however a waste of material as this reserved area is only a minor portion of the full device area.

In step S8, shown in FIG. 5H, material is removed from the second electrode side charge carrier transport layer 14 within an elongate region. Therewith a surface portion 11X is exposed to be available for an electric connection with the succeeding first electrode layer portion 11D. The removal in step S8 may be accomplished by laser ablation (also denoted as P2a laser step). The removal in step S8 also mitigates current leakage via the second electrode side charge carrier transport layer 14. Alternatively, 11X could be confined only the region of overlap of 14 and 12. In step S8, also excess material deposited in step S7 may be removed. Therewith allowing for a larger tolerance during the deposition step S7.

In subsequent step S9 shown in FIG. 5I, the second electrode layer 15 is uniformly deposited. The second electrode layer 15 forms an electrical connection with the first electrode layer 11 in the elongate connection region R3.

In further subsequent step S10, shown in FIG. 5J material is removed from the second electrode layer 15 within a second electrode layer interruption region R2 extending in the second device direction D2. As a result thereof second electrode layer portions 15C, 15D are formed. Also material of the second electrode side charge carrier transport layer portion 14D, the photovoltaic layer portion 13D, and the first electrode side charge carrier transport layer portion 12D (if present) is typically removed within this second elongate region R2, to prevent that leakage currents between the second electrode layer portions 15C, 15D could occur through these layer portions 12D, 13D, 14D. Typically step S10 is performed by laser ablation, also denoted as "P3 laser step.

Subsequent to step S10, further steps may be performed, for example to apply one or more of a protection or barrier layer, to provide electric contacts, to test the device etc. For example, as shown in FIG. 5K, in a further step S11 a barrier layer 21 may be deposited, for example a layer of silicon oxide or silicon nitride, for example deposited with a vapor deposition process, e.g. PVD, CVD or PCVD. If desired, the barrier layer 21 may comprise a stack of sub-layers for example sub-layers of silicon oxide and silicon nitride that alternate each other. Although the barrier layer 21 is particularly intended to protect the exposed side walls of the photovoltaic layer 13, the barrier layer 21 is typically deposited in a uniform manner as a deposition restricted to these side walls would be more complicated and have no additional value above a uniform deposition.

It is noted that forming of the elongate regions like R1, R2 typically are typically performed by ablation of material in these regions with a laser. Nevertheless other methods may be contemplated, e.g. using a mechanical scribing or an etching process. Also it may be contemplated to directly print or otherwise deposit the layers with the specified partitions as is the case here for the deposition of the strip 16CD. However, ablation with laser radiation is generally considered the most efficient method, as it is very accurate and is very suitable for use in roll-to-roll processing, due to the absence of any mechanical contact with the product.

In the inventive product, a bypass diode is integrated without requiring an additional layer for this purpose. This is illustrated with reference to FIG. 2C, wherein a conventional photovoltaic device with similar interconnection scheme is shown. The conventional photovoltaic device requires a separate insulating layer strip 30CD to avoid a short cut between the layer portions 15C, 11C. In the product as presently claimed the strip 16CD of the material having the first conductivity type serves a dual purpose, in that in combination with the extension 14CD of the second electrode side charge carrier transport layer portion 14C it functions as an insulator between the layer portions 15C, 11C and furthermore, in case of a reversal of polarity, due to the absence of a voltage generated in the photovoltaic device cell 15C, it serves as a bypass diode.

An alternative embodiment of the method starts from the semi-finished product obtained in step S3 as shown in FIG. 5C In a subsequent step S14, shown in FIG. 6A, a material of a second conductivity type is deposited as a uniform layer 14.

Similar to step S4 in the previous embodiment in a subsequent step S15, shown in FIG. 6B, material is removed from the photovoltaic layer 13 and the first electrode side charge carrier transport layer 12 within the interface region 1CD, extending in the second device direction. Therewith first electrode side charge carrier transport layer portions 12C, 12D are formed within the first electrode side charge carrier transport layer 12, and photovoltaic layer portions 13C, 13D are formed within the photovoltaic layer 13. Also, by removal of material from the second electrode side charge carrier transport layer 14, the latter is partitioned into a respective portion 14C, 14D at opposite sides of the interface region 1CD.

Similar to step S5, in a subsequent step S16, shown in FIG. 6C, material is removed from the first electrode layer 11 in an interrupt region R1 within the interface region 1CD and also extending in the second device direction D2. By the removal of material from the first electrode layer 11 at each side of the interrupt region R1 a first electrode layer portion 11C, 11D is formed.

In step S17, shown in FIG. 6D, a strip 17CD of material, which has a second conductivity type but which is another material than that used for the second electrode side charge carrier transport layer 14 is deposited by a patterning deposition method, like printing. Alternatively deposition may take place by an intermittent coating process. The strip 17CD is to form first junction layer that replaces the extension 14CD of the second electrode side charge carrier transport layer 14 in the previous embodiment.

As in step S7 (FIG. 5G) of the previous embodiment, in step S18, shown in FIG. 6E, a strip 16CD of material, which has a first conductivity type is deposited by a patterning deposition method, like printing. Alternatively deposition may take place by an intermittent coating process. The strip 16CD may be provided of the same material as that of the first electrode side charge carrier transport layer 12, but that is not necessary. The strip 16CD extends in the second device direction D2 and covers the strip 17CD.

In step S19, shown in FIG. 6F, the PN or NP layer pair formed by the strips 17CD, 16CD is structured, for example with a laser ablation step. It may be contemplated to directly deposit the pair of layers 17CD, 16CD with steps S17 and S18 in the desired structure as achieved here with step S19. This would however require very precise printing methods. In practice it was found more efficient to print a slightly larger region that actually required in steps S17, S18, and to subsequently structure the deposited layer pair as desired.

The junction layer pair formed by the structure strips 17CD, 16CD should have a width that provides for a PN-junction with a sufficiently large width to conduct a bypass current without an excessive heat development while not being too large to keep as much of the surface area of the photovoltaic module available for the photovoltaic cells.

In step S20, shown in FIG. 6G, an electrically conductive material is deposited as a uniform layer 15. The layer 15 of the electrically conductive material forms an electric contact with an portion 11X of a surface of the succeeding first electrode layer portion 11D that was exposed in step 6F.

In step S21, the uniform layer 15 is partitioned by an interruption region R2 into a preceding second electrode layer portion 15C, and a succeeding second electrode layer portion 15D. Also material of the second electrode side charge carrier transport layer portion 14D, the photovoltaic layer portion 13D, and the first electrode side charge carrier transport layer portion 12D may be removed within this second elongate region R2, to prevent that leakage currents between the second electrode layer portions 15C, 15D could occur through these layer portions 12D, 13D, 14D. Typically step S21 is performed by laser ablation.

FIG. 7A to 7H show a method of manufacturing with which the product of FIG. 4 may be obtained.

Starting from the semi-finished product that is obtained after step S14 (See FIG. 6A) in the second embodiment, subsequently in step S25 (FIG. 7A) an electrically conductive material is deposited as a uniform layer 15.

In subsequent step S26 (FIG. 7B) material is removed from the second electrode layer 15 within the interface region 1CD. As a result thereof second electrode layer portions 15C, 15D are formed. Also material of the second electrode side charge carrier transport layer portion 14D, the photovoltaic layer portion 13D, and the first electrode side charge carrier transport layer portion 12D is removed within this first elongate region R1.

Step S27 (FIG. 7C) corresponds to step S5 and S16 as described in the first and the second embodiment respectively.

In steps S28 (FIG. 7D) a junction layer 17CD of a material of the second conductivity type and in step S29 (FIG. 7E) a junction layer 17CD of a material of the first conductivity type are deposited to form a junction layer pair that bridges the interface region and extends over an end 15CE of the preceding second electrode layer portion 15C adjoining the interface region 1CD. Optionally an end 15DE of the succeeding second electrode layer portion 15D adjoining the interface region 1CD may also be covered as shown here. This is not at the cost of device efficiency as the covering end portions of the layers 16CD, 17CD do not impair the operation of the photovoltaic device cell stack 12D, 13D, 14D, 15D. Therewith the precision with which these layers 16CD, 17CD are deposited is not very critical.

In step S30 (FIG. 7F) material of the pair of junction layers is removed from an elongate surface region R2+R3, In step S31 (FIG. 7G) an additional electrically conductive layer portion 20CD is deposited that extends from a surface portion 15CX of the end 15CE that is left exposed by the junction layer 17CD to at least inside the elongate surface region R2+R3 where the pair of junction layers was removed.

In step S32 (FIG. 7H) material is removed from all layers above the first electrode layer 11 in a region R2. Therewith leakage currents via any of these layers is avoided.

Figure 8A:
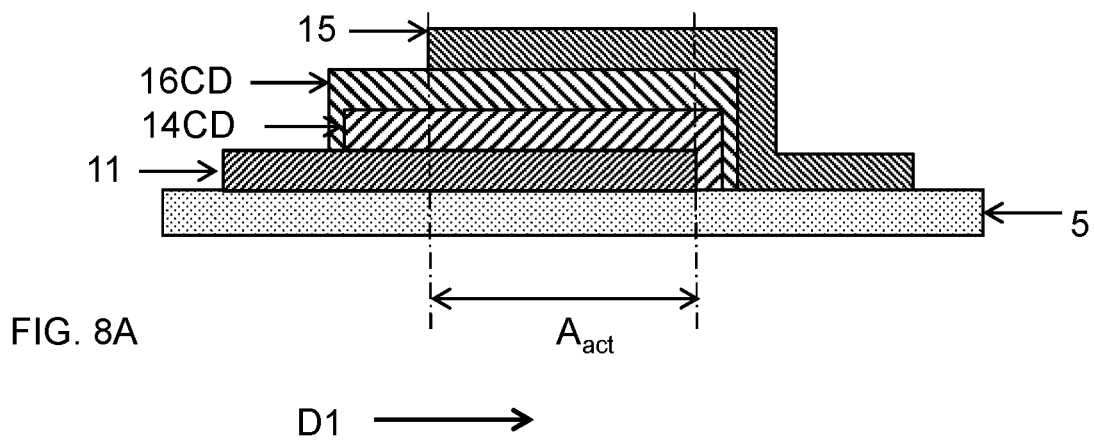
FIG. 8A, 8B illustrate experimental results indicative for the applicability of the claimed measures in a photovoltaic device.
Figure 8B:
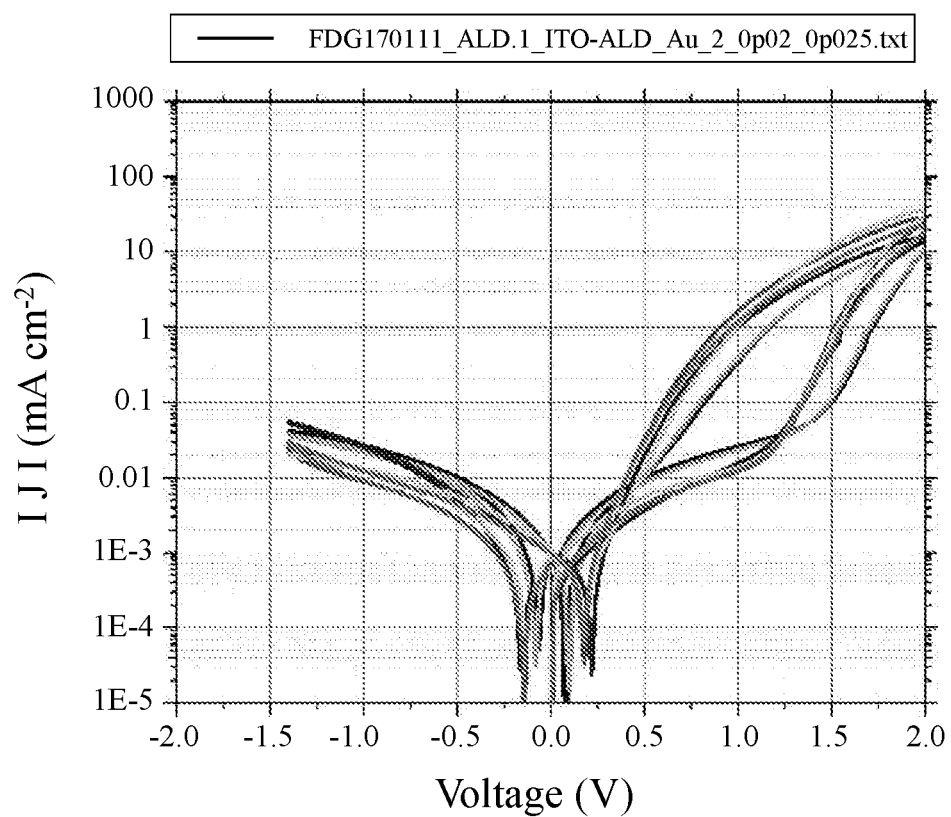

FIGS. 8A and 8B are included to illustrate experimental results indicative for the applicability of the claimed measures in a photovoltaic device. Therein FIG. 8A shows a cross-section of a pair of junction layers 14CD, 16CD, suitable as bypass diode in a perovskite based photovoltaic device, and formed by materials suitable for use in perovskite based photovoltaic devices. And FIG. 8B shows electrical characteristics of the device so obtained.

In this example, the bypass diode in FIG. 8A on substrate 5, comprises a first electrode 11 formed by an ITO-layer having thickness of 130 nm and a second electrode 15 formed by a layer of Au having a thickness of 100 nm. The pair of junction layers comprise an n-type layer 14CD of TiOx having a thickness of 15 nm, and a p-type layer 16CD of SpiroOmetad having a thickness of 200 nm.

The device was obtained using atomic layer deposition to deposit the layer 14CD of TiOx on the first electrode layer 11. The layer 16CD of SpiroOmetad was then deposited over the TiOx layer 14CD by spin coating from a solution. The second electrode layer 15 was then applied by thermal evaporation. The diode formed by the junction layer pair 14CD, 16CD has an active area $A_{act}$ of 0.16 cm$^2$ given by the overlap of the first and the second electrode 11, 15. A plurality of specimens of the device of FIG. 8A were prepared in this manner, and their electrical characteristics were measured. The results thereof are shown in FIG. 8B. It can be verified from FIG. 8A that the diodes, suitable to be provided in an integrated form in perovskite based photovoltaic devices have a proper diode behavior. The extent of overlap defining the active area $A_{act}$ can be adapted to the application. In its bypass mode, the diode for a photovoltaic device cell should be capable to conduct the current generated by the other cells at a relatively low voltage, to minimize energy losses. A minimum requirement is that its voltage in bypass mode remains below the breakdown voltage of the photovoltaic device cell (1 to 3 V) to prevent the triggering of degradation mechanism induced by breakdown. A reduction of the bypass voltage to a desired low value can easily be achieved by increasing the distance along the direction of the first device axis (D1). The active area is further proportional to the width of the device and is therewith automatically scaled with the current delivered by the photovoltaic device cells as a function of the width of the device.

Therewith it becomes apparent that the claimed measures make it possible to readily integrate a bypass diode in a perovskite based photovoltaic device (as layer 14CD and 16CD) can provide a bypass diode.

The invention claimed is:
1. A photovoltaic device comprising:
a stack of layers on a substrate, the substrate defining a plane with a first device axis and a second device axis that is transverse to the first device axis, the stack subsequently including a first electrode layer and a second electrode layer, and
a photovoltaic layer between said first electrode layer and said second electrode layer,
a second electrode side charge carrier transport layer,
wherein the photovoltaic device includes a plurality of mutually subsequent photovoltaic device cells arranged along a direction of the first device axis,
wherein each of the photovoltaic device cells comprising a respective portion of each layer in said stack of layers, each pair of a preceding photovoltaic cell and a succeeding photovoltaic cell being serially connected in an interface region extending in a direction of the second device axis,
wherein the interface region comprises a conductive layer portion and a junction layer pair,
wherein the interface region in a direction of the first device axis subsequently partitions the first electrode layer with a first electrode layer interruption region into:
a preceding first electrode layer portion forming part of the preceding photovoltaic device cell, and
a succeeding first electrode layer portion forming part of the succeeding photovoltaic device cell;
wherein the interface region in a direction of the first device axis partitions the second electrode layer with a second electrode layer interruption region into:
a preceding second electrode layer portion forming part of the preceding photovoltaic device cell, and
a succeeding second electrode layer portion forming part of the succeeding photovoltaic device cell;
wherein the conductive layer portion electrically connects the preceding second electrode layer portion with the succeeding first electrode layer portion in a connection region between the first electrode layer interruption region and the second electrode layer interruption region, and
wherein the junction layer pair comprises:
a first layer facing the preceding first electrode layer portion and being of a second conductivity type corresponding to a conductivity type of the second electrode side charge carrier transport layer, and
a second layer being of a first conductivity type opposite to a conductivity type of the first layer of the junction layer pair,
the junction layer pair thus forming a bypass diode for the preceding photovoltaic device cell wherein the second layer of the junction layer pair faces the conductive layer portion.

2. The photovoltaic device according to claim 1, further comprising a first electrode side charge carrier transport layer, being of the first conductivity type, between the first electrode layer and the photovoltaic layer.

3. The photovoltaic device according to claim 1, wherein the conductive layer portion that electrically connects the preceding second electrode layer portion with the succeeding first electrode layer portion is formed by an extension of the preceding second electrode layer portion.

4. The photovoltaic device according to claim 3, wherein the first layer of the junction layer pair is formed by an extension of a preceding second electrode side charge carrier transport layer portion.

5. The photovoltaic device according to claim 3, wherein the first layer of the junction layer pair is formed by a separate layer, of a material of the second conductivity type, that extends between:
an end of a preceding second electrode side charge carrier transport layer portion, and an end of the preceding second electrode layer portion adjoining the interface region.

6. The photovoltaic device according to claim 1, wherein the first layer of the junction layer pair is formed by a separate layer, of a material of the second conductivity type, that extends over an end of the preceding second electrode layer portion adjoining the interface region, and
wherein the conductive layer portion that electrically connects the preceding second electrode layer portion with the succeeding first electrode layer portion is a separate layer that:
forms an electric contact with the succeeding first electrode layer portion in the connection region, and
extends from the connection region over the junction layer pair to a surface of the end of the preceding second electrode layer portion that is left free by the junction layer pair.

7. The photovoltaic device according to claim 1, wherein the first layer of the junction layer pair fills the first electrode layer interruption region between the preceding first electrode layer portion and the succeeding first electrode layer portion.

8. Method of manufacturing a photovoltaic device comprising a stack of layers on a substrate, the substrate defining a plane with a first device axis and a second device axis that is transverse to the first device axis, the method comprising subsequently:
depositing a first electrode layer;
depositing a photovoltaic layer,
depositing a second electrode side charge carrier transport layer; and;
depositing a second electrode layer of the photovoltaic device;
the method further comprising:
providing a plurality of mutually subsequent, serially arranged photovoltaic device cells arranged along a direction of the first device axis, by partitioning each of the first electrode layer, the photovoltaic layer, the second electrode side charge carrier transport layer, and the second electrode layer into a respective portion of each layer for each photovoltaic device cells by providing an interface region to each pair of a preceding photovoltaic cell and a succeeding photovoltaic cell that extends in the direction of the second device axis,
wherein providing the interface region comprises:
exposing a surface of the first electrode layer within the interface region;
partitioning the first electrode layer with a first electrode layer interruption region into a preceding first electrode layer portion forming part of the preceding photovoltaic device cell and a succeeding first electrode layer portion forming part of the succeeding photovoltaic device cell;
providing a junction layer pair comprising depositing a first layer of a second conductivity type corresponding to that of the second electrode side charge carrier transport layer and subsequently depositing a second layer being of a first conductivity type opposite to that of the first layer of the junction layer pair;
providing a conductive layer portion in the interface region;
partitioning the second electrode layer with a second electrode layer interruption region into a preceding second electrode layer portion forming part of the preceding photovoltaic device cell and a succeeding second electrode layer portion forming part of the succeeding photovoltaic device cell,
electrically connecting, through the conductive layer portion, the preceding second electrode layer portion with the succeeding first electrode layer portion in a connection region between the first electrode layer interruption region and the second electrode layer interruption region,
wherein the junction layer pair is provided in the interface region.

9. The method according to claim 8, further comprising depositing a first electrode side charge carrier transport layer, subsequent to the depositing the first electrode layer and preceding the step of depositing the photovoltaic layer.

10. The method according to claim 8, wherein depositing the first layer of the second conductivity type is achieved by depositing the second electrode side charge carrier transport layer subsequent to both the exposing and the partitioning the first electrode layer, and
wherein said depositing the second electrode side charge carrier transport layer includes depositing within the interface region.

11. The method according to claim 8, wherein depositing the first layer of the second conductivity type is achieved by:
depositing the second electrode side charge carrier transport layer before said step of exposing and partitioning the first electrode layer, and
subsequently depositing a material of the second conductivity type as a separate layer extending from within the interface region over an end of the preceding portion of the second electrode side charge carrier transport layer.

12. The method according to claim 8, wherein providing the conductive layer portion is achieved by depositing the second electrode layer, subsequent to the steps of providing the junction layer pair in the interface region, and
wherein said depositing the second electrode layer includes depositing within the interface region.

13. The method according to claim 12, wherein providing conductive layer portion is achieved by, subsequent to depositing the second electrode layer, depositing an electrically conductive material as a separate electrically conductive layer portion that extends over an end of the preceding second electrode layer portion adjoining the interface region, over a connection region of the succeeding first electrode layer portion.

* * * * *